United States Patent
Cai et al.

(10) Patent No.: US 10,347,758 B2
(45) Date of Patent: Jul. 9, 2019

(54) SEMICONDUCTOR PACKAGING STRUCTURE AND SEMICONDUCTOR POWER DEVICE THEREOF

(71) Applicant: DELTA ELECTRONICS, INC., Taoyuan (TW)

(72) Inventors: Chao-Feng Cai, Taoyuan (TW); Jian-Hong Zeng, Taoyuan (TW); Zeng Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/647,278

(22) Filed: Jul. 12, 2017

(65) Prior Publication Data
US 2017/0309746 A1  Oct. 26, 2017

Related U.S. Application Data

(62) Division of application No. 15/077,927, filed on Mar. 23, 2016, now Pat. No. 9,755,070.

(30) Foreign Application Priority Data

Apr. 2, 2015 (CN) .......................... 2015 1 0154626

(51) Int. Cl.
*H01L 29/417* (2006.01)
*H01L 29/78* (2006.01)
*H01L 23/50* (2006.01)
*H01L 23/00* (2006.01)
(Continued)

(52) U.S. Cl.
CPC .......... *H01L 29/7826* (2013.01); *H01L 23/50* (2013.01); *H01L 24/20* (2013.01); *H01L 24/24* (2013.01); *H01L 29/7816* (2013.01); *H01L 29/1083* (2013.01); *H01L 29/402* (2013.01); *H01L 29/41766* (2013.01);
(Continued)

(58) Field of Classification Search
CPC ....... H01L 23/481; H01L 23/50; H01L 24/20; H01L 24/24; H01L 29/7826
See application file for complete search history.

(56) References Cited

U.S. PATENT DOCUMENTS

| 8,748,245 | B1 | 6/2014 | Stuber et al. |
| 2002/0053744 | A1 | 5/2002 | Sakamoto et al. |
| 2005/0029588 | A1 | 2/2005 | Sakamoto et al. |

(Continued)

FOREIGN PATENT DOCUMENTS

| CN | 102437187 A | 5/2012 |
| TW | 563242 B | 11/2003 |

*Primary Examiner* — Allan R Wilson
(74) *Attorney, Agent, or Firm* — CKC & Partners Co., LLC

(57) ABSTRACT

A semiconductor packaging structure includes a chip, a first pin, a second pin, and a third pin. The chip includes a first surface, a second surface, a first power switch, and a second switch, and both the first power switch and the second switch include a first terminal and a second terminal. The second surface of the chip is opposite to the first surface of the chip. The first pin does not contact to the second pin. The first terminal of the first power switch of the chip is coupled to the first pin, and the second terminal of the first power switch of the chip is coupled to the third pin. The first terminal of the second power switch of the chip is coupled to the third pin, and the second terminal of the second power switch of the chip is coupled to the second pin.

12 Claims, 8 Drawing Sheets

(51) Int. Cl.
*H01L 29/40* (2006.01)
*H01L 29/10* (2006.01)

(52) U.S. Cl.
CPC ............... *H01L 2224/04105* (2013.01); *H01L 2224/18* (2013.01); *H01L 2924/19104* (2013.01)

(56) References Cited

U.S. PATENT DOCUMENTS

| | | |
|---|---|---|
| 2006/0273383 A1 | 12/2006 | Hshieh |
| 2009/0057869 A1 | 3/2009 | Hebert et al. |
| 2009/0128968 A1 | 5/2009 | Lu et al. |
| 2010/0066431 A1 | 3/2010 | Carter |
| 2012/0313923 A1 | 12/2012 | Minami et al. |
| 2013/0242617 A1 | 9/2013 | Zhang et al. |
| 2014/0003179 A1 | 1/2014 | Girdhar et al. |
| 2016/0254231 A1 | 9/2016 | Stuber |
| 2017/0033032 A1* | 2/2017 | Lee ........................ H01L 23/481 |
| 2017/0213821 A1* | 7/2017 | Or-Bach .................. H01L 21/48 |
| 2018/0189002 A1* | 7/2018 | Seo ........................ H04B 1/3816 |

* cited by examiner

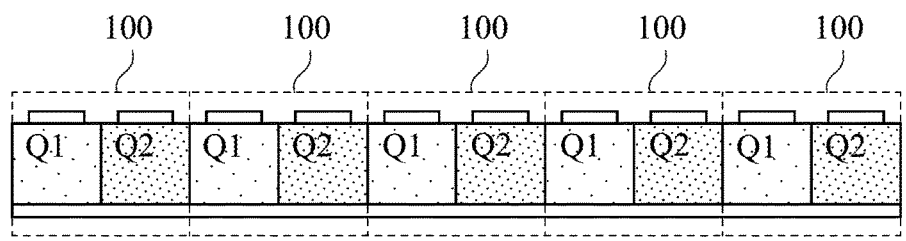
Fig. 3
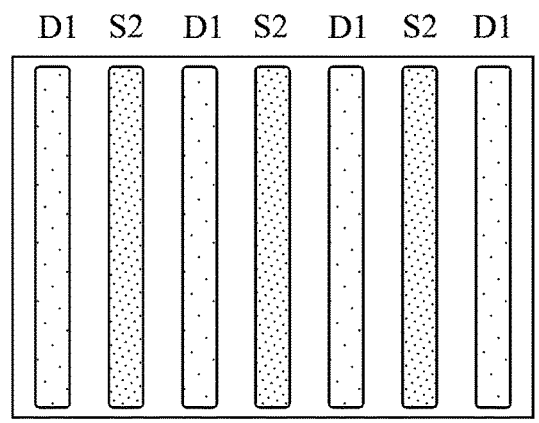
Fig. 4
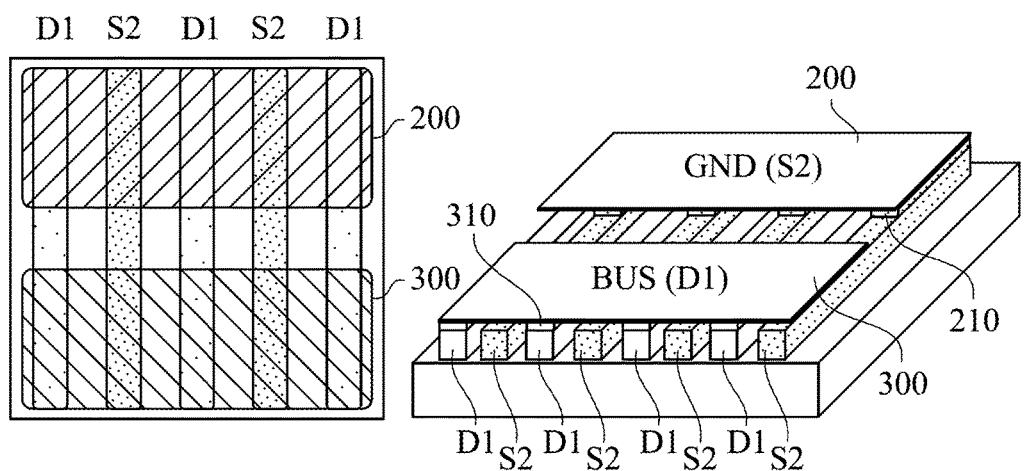
Fig. 5A
Fig. 5B

SEMICONDUCTOR PACKAGING STRUCTURE AND SEMICONDUCTOR POWER DEVICE THEREOF

RELATED APPLICATIONS

This application is a Divisional Application of U.S. application Ser. No. 15/077,927 filed Mar. 23, 2016, which claims priority to China Application Serial Number 201510154626.2 filed Apr. 2, 2015, which is herein incorporated by reference.

BACKGROUND

Field of Invention

The present invention relates to a packaging structure and a power device thereof. More particularly, the present invention relates to a semiconductor packaging structure and a semiconductor power device thereof.

Description of Related Art

Power supplies are a core member of energy conversion and also an indispensable device in the current electric power industry, electronics industry, electric machinery industry and energy industry. Important characteristics of supplies are energy conversion efficiency, power intensity, heat dissipation, and so on. The qualities of the foregoing characteristics will affect the performance of a system which employs the power supply. Hence, said important characteristics are the main purpose, which the industry searches for.

Progression of the modern power supply not only depends on the advancement of active semiconductor components and passive components (i.e., capacitors and inductors), but also depends on the method combining these elements. The combination can utilize the characteristics of each element and has become one of the most important features of the power supply. For enhancing the performance of the power supply, how to dispose and combine different elements for maximizing the performance of the whole device has become the foremost topic of development. The combination must not only use separated elements to realize the interconnection but also integrate different elements through packaging or define integrating elements in chip level.

In a power supply, the elements need to speed up to decrease switching loss, but the elements should be worked in a safe way during conversion. For achieving such goal, a half-bridge circuit is a common option, and the half-bridge circuit is a basic unit for developing a variety of circuit topology so as to provide application possibility for modern power electronic device. The performance of the whole system depends on the performance of the half-bridge circuit characteristics.

During switching, switch elements change fast from high impedance to low impedance or from low impedance to high impedance. Output current flows through the upper tube and the lower tube of the bridge arm corresponding to the change of the switch elements, and elements that are switched during the above-mentioned process need to endure switching loss. Meanwhile, there are non-ideality parasitic parameters in the whole circuit, and the switching motion will lead to additional peak voltage in elements which endure Vbus such that the safety of the elements will be affected.

For decreasing loss, the most important thing is to speed up the switching speed and minimize the turning on and off duration. However, since there is parasitic inductance in circuit, speeding up the switching speed will lead to high voltage and current rate of change such that peak voltage will generate at two terminals of the element and the safety of the elements will be threatened. In addition, in special applications (i.e., low voltage and high current), except for parasitic inductance, parasitic impedance among wires will also bring loss and affect the efficiency of the whole system.

In view of the foregoing, problems and disadvantages are associated with existing products that require further improvement. However, those skilled in the art have yet to find a solution.

SUMMARY

The following presents a simplified summary of the disclosure in order to provide a basic understanding to the reader. This summary is not an extensive overview of the disclosure and it does not identify key/critical elements of the present invention or delineate the scope of the present invention.

One aspect of the present disclosure is directed to a semiconductor packaging structure. The semiconductor packaging structure comprises a chip, a first pin, a second pin and a third pin. The chip has a first surface and a second surface opposite to the first surface. The first pin is disposed on the first surface of the chip. The second pin is disposed on the first surface of the chip, wherein the first pin and the second pin do not contact with each other. The third pin is disposed on the second surface of the chip. The chip further comprises a first power switch and a second power switch, and the first power switch includes a first terminal coupled to the first pin and a second terminal coupled to the third pin, and the second power switch includes a first terminal coupled to the third pin and a second terminal coupled to the second pin.

Another one aspect of the present disclosure is directed to a semiconductor power device. The semiconductor power device comprises a phase pin, a common substrate, a common conductive region, a first N-type epitaxial layer, a first N-type layer, a bus pin, a first P-type region, a second N-type epitaxial layer, a second N-type layer, a second P-type region, and a ground pin. The common substrate is disposed on the phase pin, which includes a first region and a second region. The common conductive region is disposed on the common substrate and at a location where the first region and the second region connected with each other. The first N-type epitaxial layer is disposed on the first region of the common substrate. The first N-type layer is disposed on the first N-type epitaxial layer. The bus pin is disposed on the first N-type layer and electrically coupled to the first N-type layer. The first P-type region is disposed on the first N-type epitaxial layer and electrically coupled to the common conductive region. The second N-type epitaxial layer is disposed on the second region of the common substrate. The second N-type layer is disposed on the second N-type epitaxial layer and electrically coupled to the common conductive region. The second P-type region is disposed on the second N-type epitaxial layer. The ground pin is disposed on the second P-type region and electrically coupled to the second P-type region.

In view of the foregoing, embodiments of the present disclosure provide a semiconductor packaging structure and a semiconductor power device thereof to minimize a loop of a bridge arm switch and a decoupling capacitor, such that an effect arose by parasitic inductor and parasitic resistor can be reduced.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows:

FIG. 3 is a cross-section diagram of a semiconductor packaging structure according to embodiments of the present invention.

FIG. 4 is a top view diagram of a semiconductor packaging structure of FIG. 3 according to embodiments of the present invention.

FIG. 5A is a top view diagram of a semiconductor packaging structure according to embodiments of the present invention.

FIG. 5B is a lateral view diagram of a semiconductor packaging structure according to embodiments of the present invention.

Figure 1:
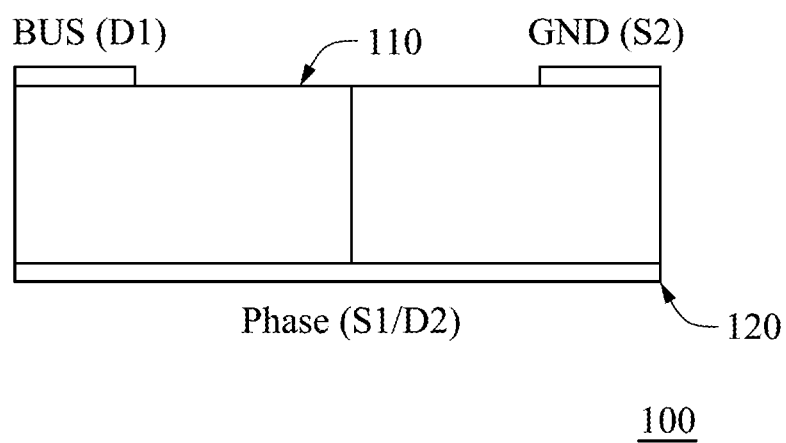
FIG. 1 is a schematic diagram of a semiconductor power device according to embodiments of the present invention.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

For minimizing a loop of a bridge arm switch and a decoupling capacitor so as to decrease an effect arose by parasitic inductance and parasitic resistor maximally, embodiments of the present disclosure provide a semiconductor packaging structure and a semiconductor power device thereof. Upper and lower tubes of a bridge arm of the semiconductor power device are integrated inside the semiconductor power device; and therefore, there is no need connecting wires outside the semiconductor power device for connection of the upper and lower tubes. Simultaneously, the size of the upper and lower tubes of the bridge arm inside the semiconductor packaging structure is minimized. The semiconductor packaging structure and the semiconductor power device thereof will be described below.

FIG. 1 is a schematic diagram of a semiconductor power device according to embodiments of the present invention. The semiconductor power device comprises a chip 100, a first pin BUS, a second pin GND, and a third pin Phase. The chip 100 comprises a first surface 110, a second surface 120, a first power switch Q1 and a second power switch Q2. The second surface 120 of the chip 100 is opposite to the first surface 110. The first pin BUS is disposed on the first surface 110 of the chip 100, and the second pin GND is also disposed on the first surface 110 of the chip 100. However, the first pin and the second pin do not contact with each other. On the other hand, the third pin Phase is disposed on the second surface 120 of the chip 100. Furthermore, the first terminal D1 of the first power switch Q1 is coupled to the first pin BUS, the second terminal S1 of the first power switch Q1 is coupled to the third pin Phase. The first terminal D2 of the second power switch Q2 is coupled to the third pin Phase, and the second terminal S2 of the second power switch Q2 is coupled to the second pin GND.

As shown in FIG. 1, the power switches of the bridge arm of the semiconductor power device (i.e., the first power switch Q1 and the second power switch Q2) are integrated inside the chip 100; and therefore, there is no need to connecting wires outside the semiconductor power device for connection of the power switch(s) of upper bridge arm and the power switch(s) of lower bridge arm. Additionally, the size of the power switches inside the semiconductor power device may be minimized thereby decreasing an effect arose by parasitic inductor and parasitic resistor. Moreover, the power electrode (i.e., the first pin BUS) of the semiconductor power device and ground terminal (i.e., the second pin GND) can be routed out from the same side of the chip 100 for capacitor to be disposed on easily so as to minimize the whole size of the half-bridge circuit.

Figure 2:
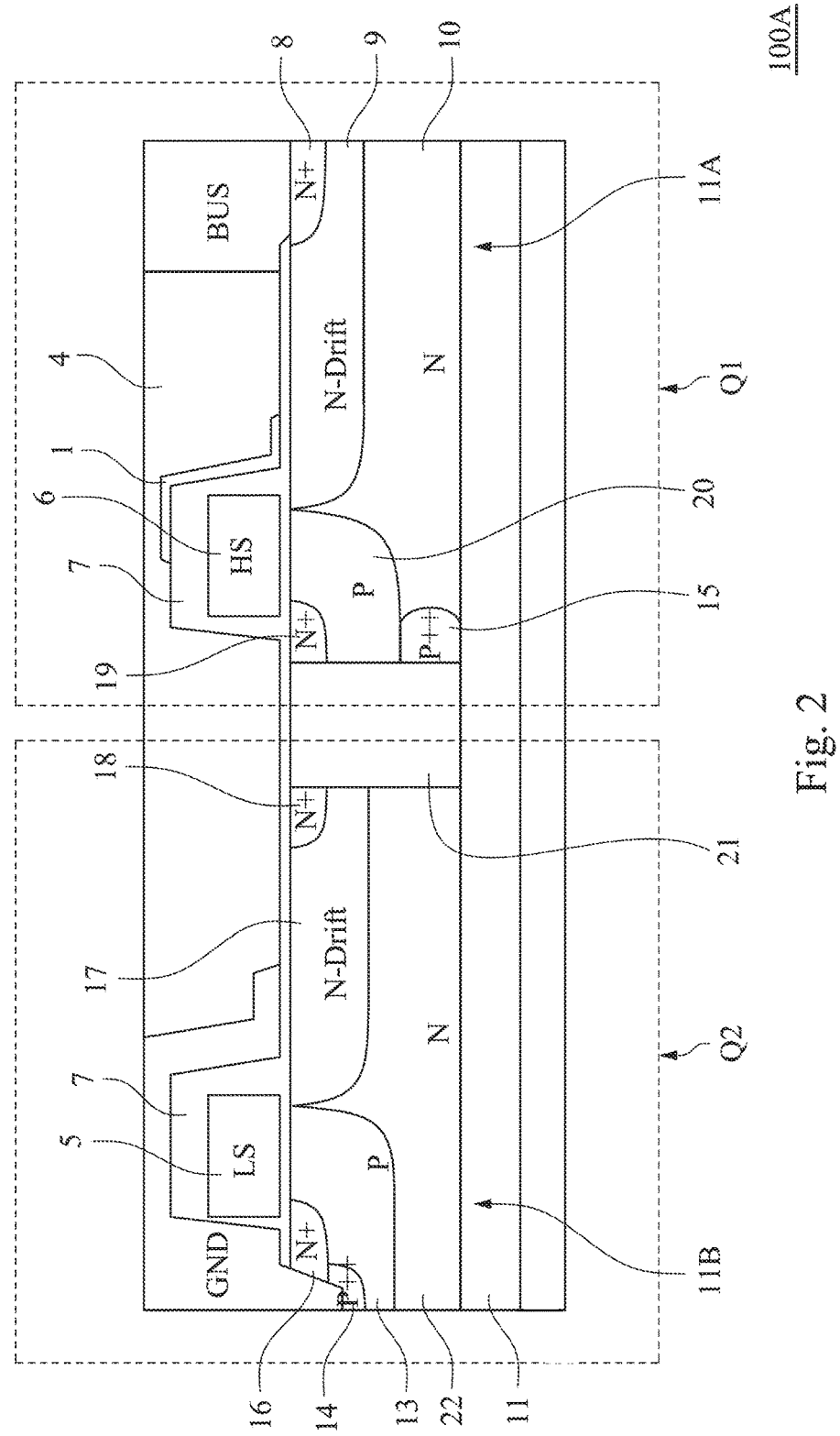
FIG. 2 is a cross-section diagram of a semiconductor power device of FIG. 1 according to embodiments of the present invention.

FIG. 2 is a cross-section diagram of a semiconductor power device of FIG. 1 according to embodiments of the present invention. As shown in FIG. 2, the chip 100A further comprises a common substrate 11 and a common conductive region 21. The common substrate 11 comprises a first region 11A and a second region 11B. In one embodiment, the common substrate 11 can be a P-type substrate material. The common substrate 11 is disposed on the third pin Phase, and the common conductive region 21 is disposed on the common substrate 11, which is located at the junction of the first region 11A and the second region 11B.

In addition, the first power switch Q1 comprises a first N-type epitaxial layer 10, a first N-type layer 9, a first N-type region 8, a first P-type region 20, and a second N-type region 19. In one embodiment, the first N-type layer 9 and the first P-type region 20 can be formed by ion implantation or epitaxial regrowth. The first N-type epitaxial layer 10 is disposed on the first region 11A of the common substrate 11. The first N-type layer 9 is disposed on the first N-type epitaxial layer 10. The first N-type region 8 is disposed on the first N-type layer 9 and in contact with the first pin BUS. The first P-type region 20 is disposed on the first N-type extension layer 10. The second N-type region 19 is disposed on the first P-type region 20 and in contact with the common conductive region 21. In one embodiment, the first N-type layer 9 can be drift region of the first power switch Q1, and the first P-type region 20 can be channel substrate of the first power switch Q1.

In another embodiment, the first power switch Q1 further comprises a P-type heavy doped region 15. The P-type heavy doped region 15 is disposed on the first region 11A of the common substrate 11 and contacts with the first N-type epitaxial layer 10, the first P-type region 20, and the common conductive region 21. In one embodiment, the P-type heavy doped region 15 can be formed by ion implantation or epitaxial regrowth.

In another embodiment, the first power switch Q1 further comprises a control terminal 6 and an insulated layer 7. The control terminal 6 is disposed on the first P-type region 20. In one embodiment, the control terminal 6 can be made of polycrystalline material or metal conductor, and the control terminal 6 can be used as the gate of the first power switch Q1. In addition, the insulated layer 7 can be isolation oxide, and the insulated layer 7 may cover the control terminal 6 for electrically isolating the control terminal 6. In still another embodiment, the first power switch Q1 further comprises a metal layer 1 (i.e., field plate), and the metal layer 1 is disposed on the insulated layer 7 and adjacent to the first pin BUS for enhancing voltage endurance of the first power switch Q1 and improving distribution of parasitic capacitor.

In yet another embodiment, the second power switch Q2 further comprises a second N-type epitaxial layer 22, a second N-type layer 17, a second P-type region 13, a third N-type region 16, and a fourth N-type region 18. In one embodiment, the second N-type layer 17 and the second P-type region 13 can be formed by ion implantation or epitaxial regrowth. The second N-type epitaxial layer 22 is disposed on the second region 11B of the common substrate 11. The second N-type layer 17 is disposed on the second N-type epitaxial layer 22. The second P-type region 13 is disposed on the second N-type epitaxial layer 22. The third N-type region 16 is disposed on the second P-type region 13 and in contact with the second pin GND. The fourth N-type region 18 is disposed on the second N-type layer 17 and in contact with the common conductive region 21. In one embodiment, the second N-type layer 17 can be a drift region of the second power switch Q2, and the second P-type region 13 can be a channel substrate of the second power switch Q2.

In another embodiment, the second power switch Q2 further comprises a third P-type region 14, and the third P-type region 14 is disposed on the second P-type region 13 and in contact with the third N-type region 16. In one embodiment, the third P-type region 14 can be formed by high concentration ion implantation so as to decrease parasitic effect of elements inside the second power switch Q2. In another embodiment, the second power switch Q2 further comprises a control terminal 5 and an insulated layer 7. The control terminal 5 is disposed on the second P-type region 13. The insulated layer 7 covers the control terminal 5. In one embodiment, the control terminal 5 can be made of polycrystalline material or metal conductor, and the control terminal 5 can be the gate of the second power switch Q2. In addition, the insulated layer 7 can be isolation oxide, and the insulated layer 7 may cover the control terminal 5 for isolating the control terminal 5. In addition, insulation material 4 is formed between the first pin BUS and the second pin GND for electrically isolating the first pin BUS and the second pin GND.

It is noted that the above-mentioned embodiments introduce a basic unit (i.e., chip 100) of the semiconductor power device of the present invention. However, in practical application, the semiconductor power device can comprises a plurality of chips 100. These chips 100 can be distributed in an interlaced manner or in lots of areas, which will be described below.

FIG. 3 is a cross-section diagram of a semiconductor packaging structure according to embodiments of the present invention. The semiconductor packaging structure comprises a plurality of chips 100 as shown in FIG. 1. In this embodiment, the chip 100 is distributed in an interlaced manner. As shown in FIG. 3, the chips 100 can share the third pin Phase, and the first power switch Q1 and the second power switch Q2 of the chip 100 are disposed in an interlaced manner. Specifically, the disposition sequence of the power switches in the semiconductor packaging structure is the first power switch Q1, the second power switch Q2, the first power switch Q1, the second power switch Q2, and so on.

FIG. 4 is a top view diagram of a semiconductor packaging structure of FIG. 3 according to exemplary embodiments of the present invention. As can be seen in FIG. 4, the first pin BUS of the chip 100 are disposed in sequence to form a plurality of first strip-shaped pins D1, and the second pin GND of the chip 100 are disposed in sequence to form a plurality of second strip-shaped pins S2.

For facilitating operation of attaching the capacitor to the semiconductor packaging structure, a plurality of first strip-shaped pins D1 as shown in FIG. 4 can be routed together to form an electrode, and a plurality of second strip-shaped pins S2 as shown in FIG. 4 can be routed together to form another electrode. The foregoing electrodes are electrode 200 and electrode 300 as shown in FIGS. 5A and 5B. Two terminals of the capacitor may be attached to the electrode 200 and the electrode 300. As shown in FIG. 5A, the first strip-shaped pins D1 can be routed together and the second strip-shaped pins S2 can be routed together by coupling the first electrode 200 to the first strip-shaped pin D1 and coupling the second electrode 300 to the second strip-shaped pin S2.

As shown in FIG. 5B, in one embodiment, conductive blocks 210 are disposed on the second strip-shaped pins S2. Since the position of the conductive block 210 is higher than that of the second strip-shaped pin S2, if the first electrode 200 is disposed on the second strip-shaped pin S2 with the conductive block 210, the first electrode 200 can only be electrically coupled to the second strip-shaped pin S2 through the conductive block 210 not coupled to the first strip-shaped pin D1. Owing to the foregoing disposition, the second strip-shaped pins S2 can be routed together. On the other hand, in one embodiment, conductive blocks 310 are disposed on the first strip-shaped pins D1. For the same reason as described above, the second electrode 300 can only be electrically coupled to the first strip-shaped pin D1 through the conductive blocks 310 not coupled to the second strip-shaped pins S2. Owing to the foregoing disposition, the first strip-shaped pins D1 can be routed together.

Figure 6:
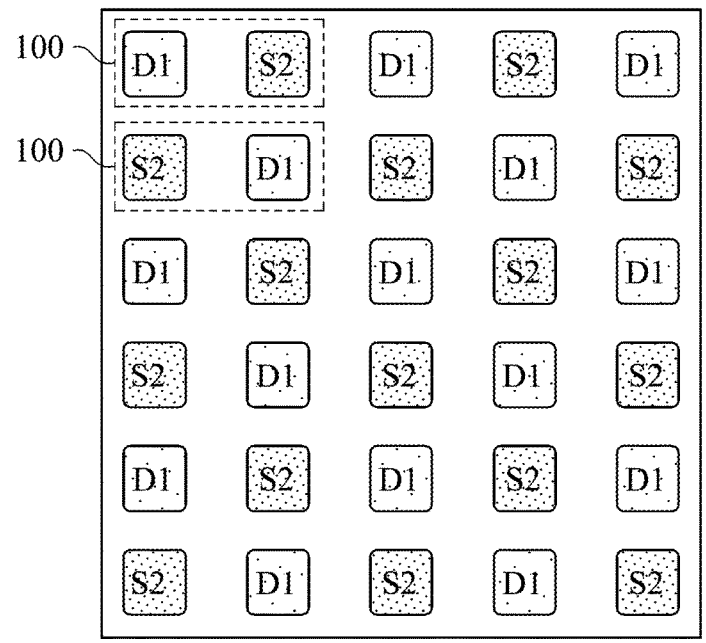
FIG. 6 is a top view diagram of a semiconductor packaging structure according to embodiments of the present invention.

FIG. 6 is a top view diagram of a semiconductor packaging structure according to embodiments of the present invention. The semiconductor packaging structure comprises a plurality of chips 100 as shown in FIG. 1. Compared with distribution in an interlaced manner as shown in FIG. 3, the chips 100 as shown in FIG. 6 are distributed in another interlaced manner, and the another interlaced manner forms a matrix electrode.

Figure 7:
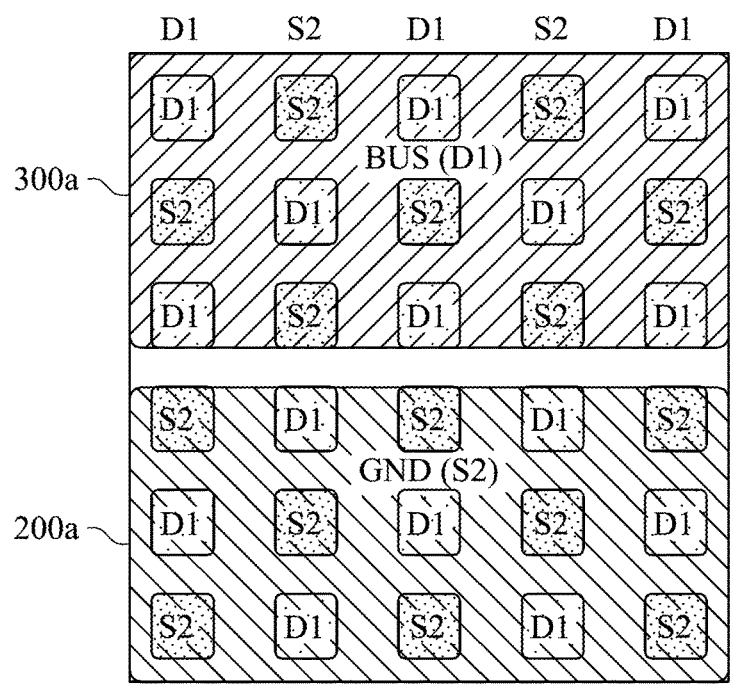
FIG. 7 is a top view diagram of a semiconductor packaging structure of FIG. 6 according to embodiments of the present invention.

FIG. 7 is a top view diagram of a semiconductor packaging structure of FIG. 6 according to embodiments of the present invention. As shown in FIG. 7, the electrodes D1 of the matrix electrode can be routed together and the electrodes S2 of the matrix electrode can be routed together by connection of conductive wiring layers to form two independent electrodes 200a and 300a. Two terminals of the capacitor may therefore be attached to the independent electrodes 200a and 300a.

Figure 8:
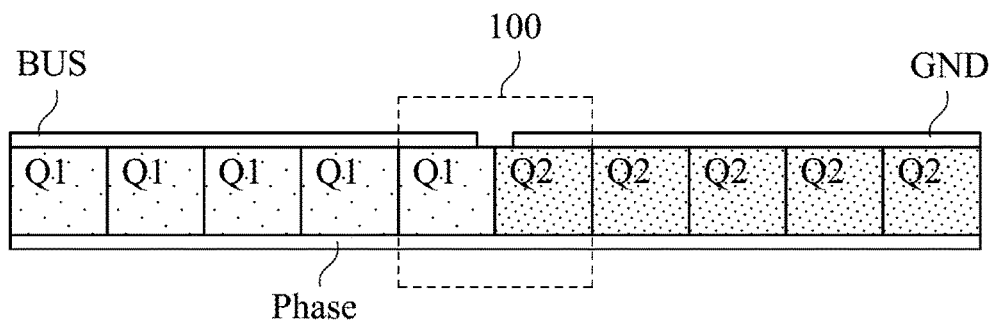
FIG. 8 is a cross-section diagram of a semiconductor packaging structure according to embodiments of the present invention.

FIG. 8 is a cross-section diagram of a semiconductor packaging structure according to embodiments of the present invention. The semiconductor packaging structure comprises a plurality of chips 100 as shown in FIG. 1. Compared with distribution in an interlaced manner as shown in FIG. 3, the chips 100 as shown in FIG. 8 are distributed in the way of gathering the first power switches Q1 in an area and gathering the second power switches Q2 in another area, which is called an area distribution. As shown in FIG. 8, the first power switches Q1 of chips 100 share the first pin BUS, the second power switches Q2 of chips 100 share the second pin GND, and the first power switches Q1 and the second power switches Q2 share the third pin Phase.

Figure 9:
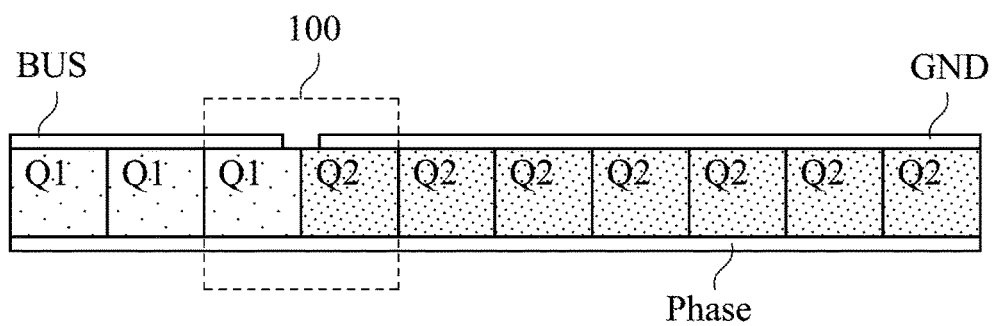
FIG. 9 is a cross-section diagram of a semiconductor packaging structure according to embodiments of the present invention.

FIG. 9 is a cross-section diagram of a semiconductor packaging structure according to embodiments of the present invention. The semiconductor packaging structure comprises a plurality of chips 100 as shown in FIG. 1. Similar to the embodiment in FIG. 8, the distribution of the chips 100 herein is the area distribution. The difference between FIG. 8 and FIG. 9 is the number of the first power switches Q1 is different from that of the second power switches Q2 in the semiconductor packaging structure as shown in FIG. 9. The reason to such difference is that the power requirements of upper and lower tubes of a bridge arm (i.e., the first power switch Q1 and the second power switch Q2) are not the same in practical application. Actually, the power capacities of the first power switch Q1 and the second power switch Q2 of the bridge arm change due to the change of the duty cycle, and the number of the first power switches Q1 and the number of the second power switches Q2 will be changed accordingly. The ratio of the number of the first power switches Q1 to that of the second power switch Q2 is about 1%~99%.

Figure 10:
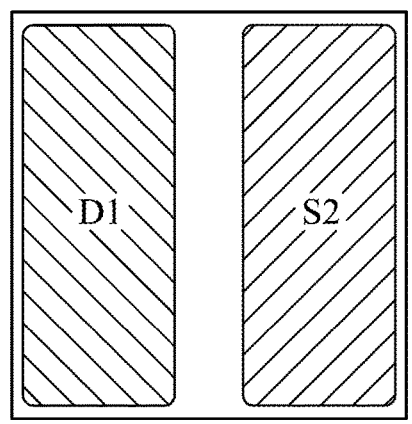
FIG. 10 is a top view diagram of a semiconductor packaging structure of FIG. 9 according to embodiments of the present invention.

FIG. 10 is a top view diagram of a semiconductor packaging structure of FIGS. 8, 9 according to embodiments of the present invention. Since the chips 100 in FIG. 10 employ the area distribution, the first power switches Q1 of the chips 100 share the first pin BUS to form the first sheet-shaped pin D1, and the second power switches Q2 of the chips 100 share the second pin GND to form the second sheet-shaped pin S2.

Figure 11:
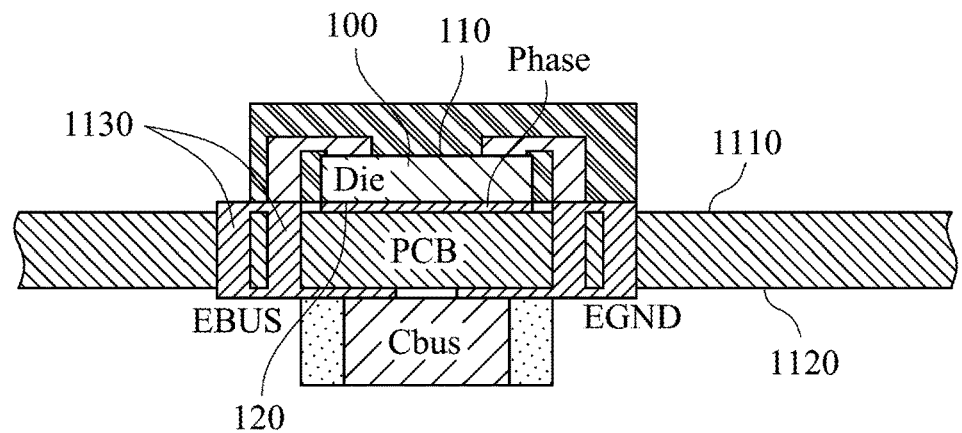
FIG. 11 is a schematic diagram of a semiconductor packaging structure according to embodiments of the present invention.

FIG. 11 is a schematic diagram of a semiconductor packaging structure according to embodiments of the present invention. As shown in the figure, the semiconductor packaging structure further comprises a circuit board PCB and a capacitor Cbus. The circuit board PCB comprises a first surface 1110, a second surface 1120, and a plurality of holes 1130. The second surface 1120 of the circuit board PCB is opposite to the first surface 1110 of the circuit board PCB. The holes 1130 drill through the circuit board PCB. The capacitor Cbus is disposed on the second surface 1120 of the circuit board PCB. In addition, the chip 100 is disposed on the first surface 1110 of the circuit board PCB, and the second surface 120 of the chip 100 is in contact with the first surface 1110 of the circuit board PCB. Besides, the first pin BUS and the second pin GND pass through the holes 1130 of the circuit board PCB to form a first electrode EBUS and a second electrode EGND on the second surface 1120 of the circuit board PCB correspondingly. Since interconnection can be implemented by the foregoing distribution of the chip 100, the size of the first power switch Q1 and the second power switch Q2 can be reduced. As shown in figure, the size of the total wires in the circuit board PCB is decreased thereby further minimizing the size of effective loops.

Figure 12:
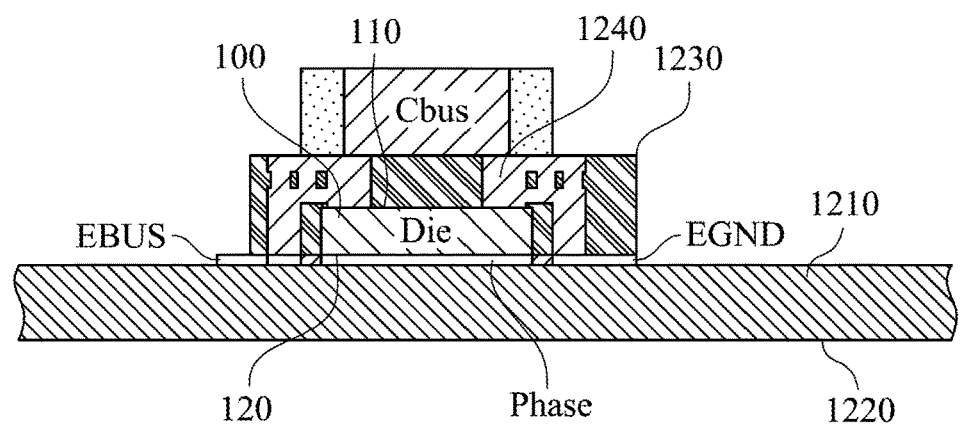
FIG. 12 is a schematic diagram of a semiconductor packaging structure according to embodiments of the present invention.

FIG. 12 is a schematic diagram of a semiconductor packaging structure according to embodiments of the present invention. As shown in the figure, the semiconductor packaging structure further comprises a circuit board PCB, a packaging layer 1230, and a capacitor Cbus. The circuit board PCB comprises a first surface 1210 and a second surface 1220. The packaging layer 1230 comprises a plurality of holes 1240. Compared with the disposition of the semiconductor packaging structure as shown in FIG. 11, for example, the chip 100 and the capacitor Cbus are disposed at different sides of the circuit board PCB, the chip 100 and the capacitor Cbus of semiconductor packaging structure as shown in FIG. 12 are disposed at the same side of the circuit board PCB, which will be described below.

As shown in FIG. 12, the second surface 1220 of the circuit board PCB is opposite to the first surface 1210. The chip 100 is disposed on the first surface 1210 of the circuit board PCB, and the second surface 120 of the chip 100 is in contact with the first surface 1210 of the circuit board PCB. The packaging layer 1230 covers the chip 100. The holes 1240 drill through the packaging layer 1230. The first pin BUS and the second pin GND pass through the holes 1240 of the packaging layer 1230 to form a first electrode EBUS and a second electrode EGND on the packaging layer 1230 correspondingly, and the first electrode EBUS and a second electrode EGND are coupled to the first pin BUS and the second pin GND through the holes 1240. Therefore, the capacitor Cbus can be attached to the surface of the packaging layer 1230 of the chip 100 directly such that the wiring of the circuit board PCB and the parasitic parameter caused by the hole can be totally eliminated so as to reduce elements which shall be disposed on the circuit board PCB.

Figure 13:
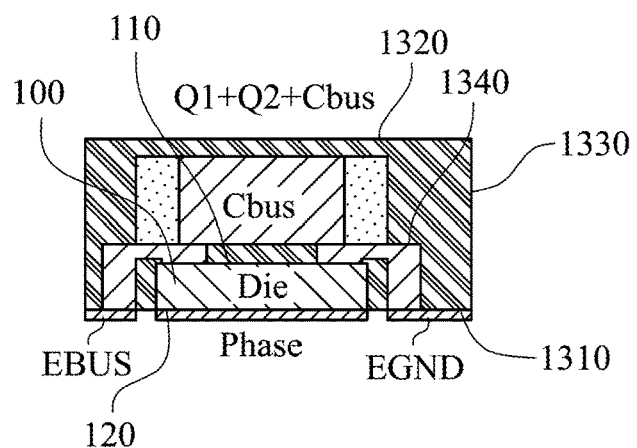
FIG. 13 is a schematic diagram of a semiconductor packaging structure according to embodiments of the present invention.

FIG. 13 is a schematic diagram of a semiconductor packaging structure according to embodiments of the present invention. As shown in the figure, the semiconductor packaging structure comprises a chip 100, a capacitor Cbus, and a packaging layer 1330. The packaging layer 1330 comprises a first surface 1310, a second surface 1320, and a plurality of holes 1340. The capacitor Cbus is disposed on the first surface 110 of the chip 100 and in contact with the first pin BUS and the second pin GND. The packaging layer 1330 covers the chip 100 and the capacitor Cbus. The second surface 1320 of the packaging layer 1330 is opposite to the first surface 1310. The holes 1340 pass through the packaging layer 1330. In addition, the first pin BUS and the second pin GND pass through the holes 1340 of the packaging layer 1330 to form the first electrode EBUS and the second electrode EGND on the first surface 1310 of the packaging layer 1330. The third pin Phase exposes from the first surface 1310 of the packaging layer 1330. As shown in the figure, the capacitor Cbus is integrated inside the packaging layer 1330 thereby decreasing the parasitic effect in the loop of the bridge arm.

Figure 14:
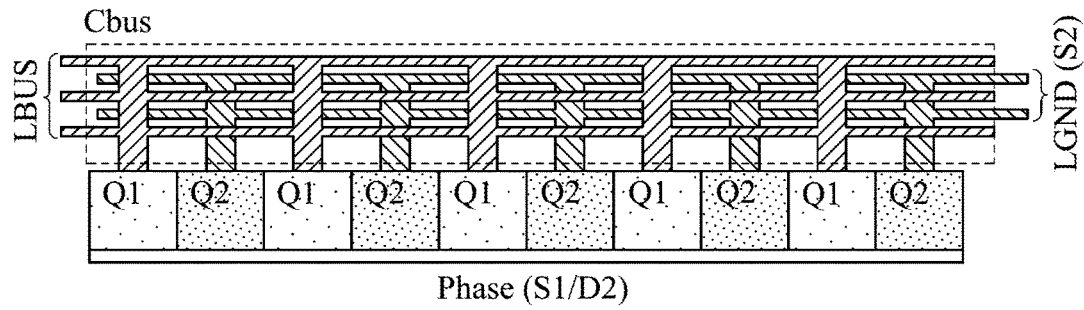
FIG. 14 is a schematic diagram of a semiconductor packaging structure according to embodiments of the present invention.

FIG. 14 is a schematic diagram of a semiconductor packaging structure according to embodiments of the present invention. Compared with the semiconductor packaging structure as shown in FIG. 3, the semiconductor packaging structure herein further comprises a plurality of first conductive layers LBUS and a plurality of second conducting layers LGND. The first conductive layers LBUS are coupled to the first pin BUS, the second conductive layers LGND are coupled to the second pin GND, and the second conductive layers LGND and the first conductive layers LBUS are disposed in an interlaced manner. In addition, the number of the first conductive layers LBUS can be different from or the same as the number of the second conductive layers LGND depending on actual requirements.

Figure 15:
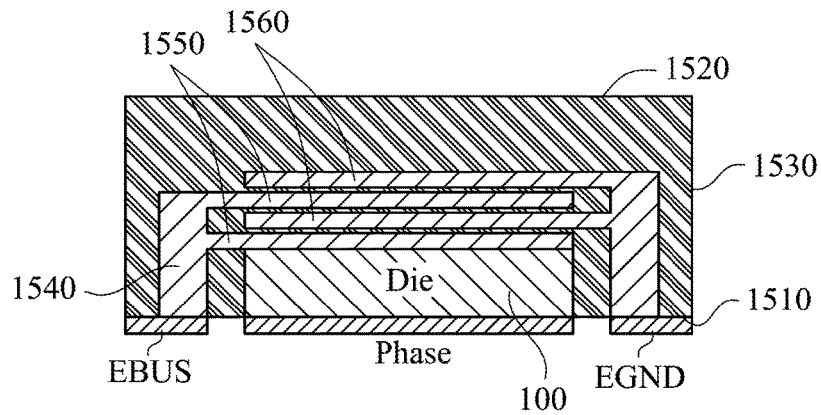
FIG. 15 is a schematic diagram of a semiconductor packaging structure according to embodiments of the present invention.

FIG. 15 is a schematic diagram of a semiconductor packaging structure according to embodiments of the present invention. As shown in the figure, the semiconductor packaging structure comprises a chip 100 and a packaging layer 1530. The packaging layer 1530 comprises a first surface 1510, a second surface 1520, and a plurality of holes 1540. The packaging layer 1530 covers the chip 100. The second surface 1520 of the packaging layer 1530 is opposite to the first surface 1510. The holes 1540 of the packaging layer 1530 pass through the packaging layer 1530. In addition, the first pin BUS and the second pin GND form a plurality of first electrode layers 1550 and a plurality of second electrode layers 1560 inside the packaging layer 1530 respectively, and the first electrode layers 1550 and the second electrode layers 1560 are disposed in an interlaced manner. The first pin BUS and the second pin GND pass through the holes 1540 of the packaging layer 1530 to form the first electrode EBUS and the second electrode EGND on the first surface 1510 of the packaging layer 1530, and the third pin Phase exposes from the first surface 1510 of the packaging layer 1530. All pins BUS, GND, Phase can be routed out from the same side of the foregoing structure. When implementing the integrated capacitor Cbus, the redistribution layer (RDL) can be routed out transversely to form the first pin BUS and the second pin GND respectively, and the first pin BUS and the second pin GND can be routed out with the third pin phase from one side of the whole element for users to attach it to the system application board.

Figure 16:
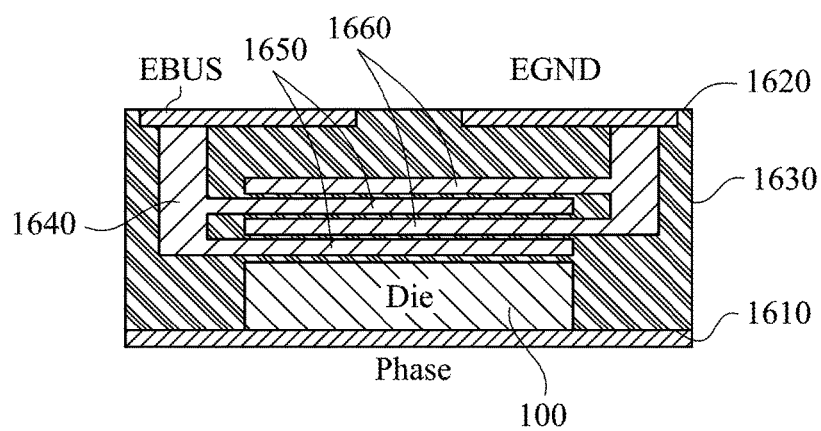
FIG. 16 is a schematic diagram of a semiconductor packaging structure according to embodiments of the present invention.

FIG. 16 is a schematic diagram of a semiconductor packaging structure according to an exemplary embodiment. As shown in the figure, the semiconductor packaging structure comprises a chip 100 and a packaging layer 1630. The packaging layer 1630 comprises a first surface 1610, a second surface 1620, and a plurality of holes 1640. The second surface 1620 is opposite to the first surface 1610. The holes 1640 pass through the packaging layer 1630. In addition, the first pin BUS and the second pin GND form a plurality of first electrode layers 1650 and a plurality of second electrode layers 1660 inside the packaging layer 1630 respectively, and the first electrode layers 1650 and the second electrode layers 1660 are disposed in an interlaced manner. The first pin BUS and the second pin GND pass through the holes 1640 of the packaging layer 1630 to form the first electrode EBUS and the second electrode EGND on the second surface 1620 of the packaging layer 1630, and the third pin Phase exposes from the first surface 1610 of the packaging layer 1630. The structure in the embodiment is suitable for some special applications, for example, applications which require abilities of great heat dissipation and high power density, or applications which require to bury elements inside. Therefore, since the pins are routed out form opposite surfaces of the semiconductor packaging structure (that is to say, the first pin BUS, the second pin GND, and the third pin Phase are routed out form opposite surfaces of the semiconductor packaging structure respectively), the distance from the surface electrode of the chip 100 to the foregoing pins can be minimized; meanwhile, the opposite surfaces of the semiconductor packaging structure can both dissipate heat.

Figure 17:
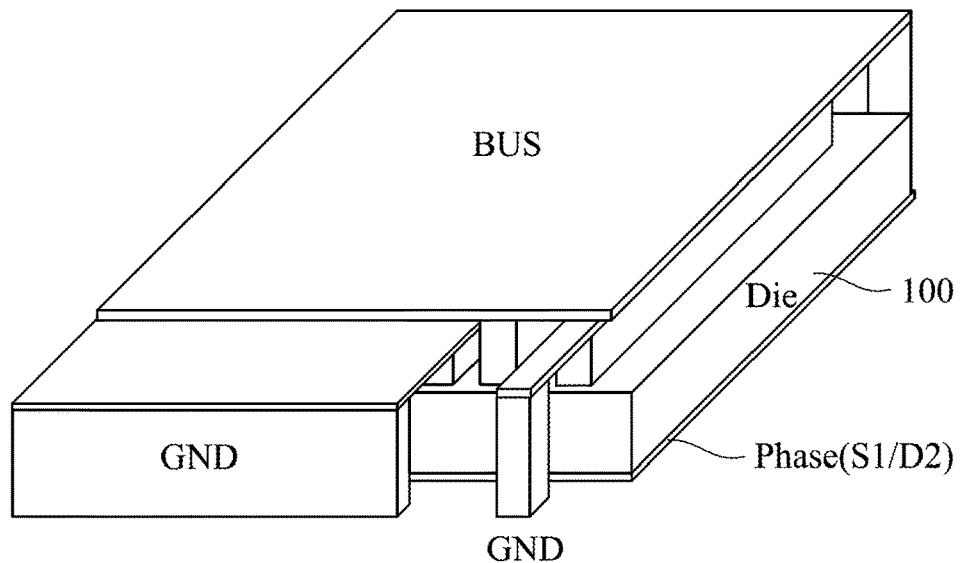
FIG. 17 is a schematic diagram of a semiconductor packaging structure according to embodiments of the present invention.

FIG. 17 is a schematic diagram of a semiconductor packaging structure according to embodiments of the present invention. For facilitating detection of the semiconductor packaging structure of the embodiment of the present invention, the first pin BUS or the second pin GND of the semiconductor packaging structure can be routed out and regard as a detecting pin.

Figure 18:
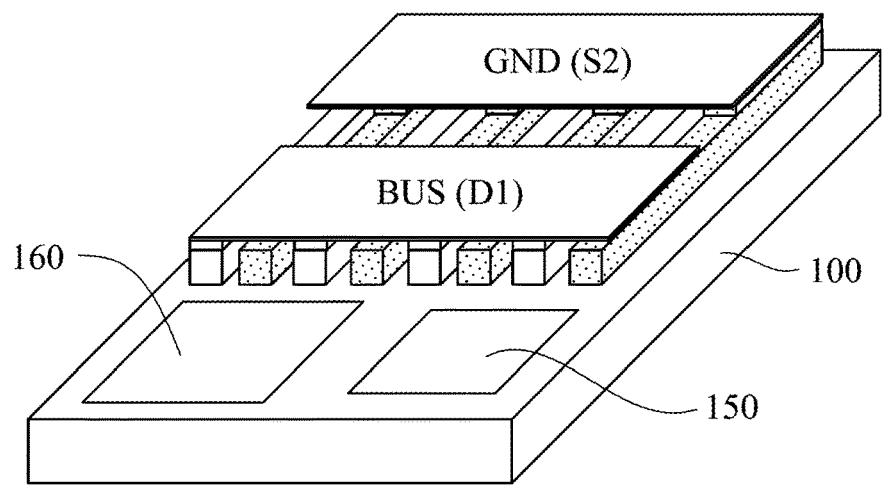
FIG. 18 is a schematic diagram of a semiconductor packaging structure according to embodiments of the present invention.

FIG. 18 is a schematic diagram of a semiconductor packaging structure according to embodiments of the present invention. For facilitating detection of the semiconductor packaging structure of the embodiment of the present invention, a detection circuit 150 can be disposed on the chip 100 for detecting the chip 100. In addition, a control circuit 160 can be disposed on the chip 100 for controlling the chip 100.

In view of the above embodiments of the present disclosure, it is apparent that the application of the present disclosure has the advantages as follows. embodiments of the present disclosure provide a semiconductor packaging structure and a semiconductor power device thereof to integrate upper and lower tubes (i.e., the first power switch Q1 and the second power switch Q2) of a bridge arm of the semiconductor power device inside the chip; and therefore, there is no need connecting wires outside the chip for connection of the upper and lower tubes. Simultaneously, the size of the upper and lower tubes of the bridge arm inside the semiconductor packaging structure is minimized thereby decreasing an effect arose by parasitic inductance and parasitic resistor maximally. Moreover, the power electrode (i.e., the first pin BUS) of the semiconductor power device provided by the embodiment of the present invention and ground terminal (i.e., the second pin GND) can be routed out from the same side of the chip 100 for capacitor to be disposed on easily so as to minimize the whole size of the half-bridge circuit.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor packaging structure, comprising:
a chip having a first surface and a second surface opposite to the first surface;
a first pin disposed on the first surface of the chip, wherein the first pin is a sheet-shaped pin;
a second pin disposed on the first surface of the chip, wherein the second pin is a sheet-shaped pin, wherein the first pin and the second pin do not contact with each other; and
a third pin disposed on the second surface of the chip;
wherein the chip comprises a plurality of the first power switches and a plurality of the second power switches, wherein the first power switches share the first pin, and the second power switches share the second pin, wherein the first pin and the second pin are different conductivity type pins.

2. The semiconductor packaging structure according to claim 1, wherein the first power switches and the second power switches share the third pin.

3. The semiconductor packaging structure according to claim 1, further comprising:
a plurality of first conductive layers coupled to the first pin; and
a plurality of second conductive layers disposed with the first conductive layers in an interlaced manner and coupled to the second pin.

4. The semiconductor packaging structure according to claim 1, wherein at least one of the first pin and the second pin works as a detection pin.

5. The semiconductor packaging structure according to claim 1, further comprising:
a detection circuit disposed on the chip and configured to detect the chip.

6. A semiconductor packaging structure, comprising:
a chip having a first surface and a second surface opposite to the first surface;
a first pin disposed on the first surface of the chip;
a second pin disposed on the first surface of the chip, wherein the first pin and the second pin do not contact each other;
a third pin disposed on the second surface of the chip; a packaging layer covering the chip, wherein the packaging layer comprises a first surface and a second surface opposite to the first surface;
wherein the chip further comprises a first power switch and a second power switch, and the first power switch includes a first conductivity type terminal coupled to the first pin and a second conductivity type terminal coupled to the third pin, and the second power switch includes a first conductivity type terminal coupled to the third pin and a second conductivity type terminal coupled to the second pin, and the third pin exposes from the first surface of the packaging layer, and the first conductivity type terminal is different form the second conductivity type terminal.

7. The semiconductor packaging structure according to claim 6, further comprising:
a capacitor disposed on the first surface of the chip and in contact with the first pin and the second pin, wherein the packaging layer further covers the chip and the capacitor; and
a plurality of holes passing through the packaging layer;
wherein the first pin and the second pin pass through the holes of the packaging layer to form a first electrode and a second electrode on the first surface of the packaging layer correspondingly.

8. The semiconductor packaging structure according to claim 6, wherein the packaging layer further comprises a plurality of holes passing through the packaging layer, and the first pin and the second pin form a plurality of first electrode layers and a plurality of second electrode layers respectively in the packaging layer, and the first electrode layers and the second electrode layers are disposed interlaced with each other, wherein the first pin and the second pin pass through the holes of the packaging layer to form a first electrode and a second electrode on the first surface of the packaging layer correspondingly.

9. The semiconductor packaging structure according to claim 6, wherein the packaging layer further comprises a plurality of holes passing through the packaging layer, and the first pin and the second pin form a plurality of first electrode layers and a plurality of second electrode layers in the packaging layer respectively, and the first electrode layers and the second electrode layers are disposed interlaced with each other, wherein the first pin and the second pin pass through the holes of the packaging layer to form a first electrode and a second electrode on the second surface of the packaging layer correspondingly.

10. The semiconductor packaging structure according to claim 6, further comprising:
a plurality of first conductive layers coupled to the first pin; and
a plurality of second conductive layers disposed with the first conductive layers in an interlaced manner and coupled to the second pin.

11. The semiconductor packaging structure according to claim 6, wherein at least one of the first pin and the second pin works as a detection pin.

12. The semiconductor packaging structure according to claim 6, further comprising:
a detection circuit disposed on the chip and configured to detect the chip.

* * * * *